(12) United States Patent
Qian et al.

(10) Patent No.: US 8,071,429 B1
(45) Date of Patent: Dec. 6, 2011

(54) WAFER DICING USING SCRIBE LINE ETCH

(75) Inventors: Yin Qian, Milpitas, CA (US);
Hsin-Chih Tai, San Jose, CA (US); Duli Mao, Sunnyvale, CA (US); Vincent Venezia, Los Gatos, CA (US); Wei Zheng, Los Gatos, CA (US);
Keh-Chiang Ku, Cupertino, CA (US);
Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/954,151

(22) Filed: Nov. 24, 2010

(51) Int. Cl.
*H01L 21/304* (2006.01)

(52) U.S. Cl. .................. 438/113; 257/E21.238

(58) Field of Classification Search .......... 438/68, 438/113; 257/E21.238
See application file for complete search history.

(56) References Cited

U.S. PATENT DOCUMENTS

| | | | |
|---|---|---|---|
| 2007/0184633 A1* | 8/2007 | Yang | 438/460 |
| 2008/0286938 A1* | 11/2008 | Pu et al. | 438/458 |
| 2009/0011543 A1* | 1/2009 | Karta et al. | 438/114 |
| 2009/0191690 A1 | 7/2009 | Boyle et al. | |
| 2009/0289318 A1* | 11/2009 | Lin et al. | 257/433 |

* cited by examiner

*Primary Examiner* — N Drew Richards
*Assistant Examiner* — Daniel Shook
(74) *Attorney, Agent, or Firm* — Blakely Sokoloff Taylor & Zafman LLP

(57) ABSTRACT

Embodiments of a method for separating dies from a wafer having first and second sides. The process embodiment includes masking the first side of the wafer, the mask including openings therein to expose parts of the first side substantially aligned with scribe lines of the wafer. The process embodiment also includes etching from the exposed parts of the first side of the wafer until an intermediate position between the first and second sides and sawing the remainder of the wafer, starting from the intermediate position until reaching the second surface.

12 Claims, 10 Drawing Sheets

WAFER DICING USING SCRIBE LINE ETCH

TECHNICAL FIELD

This disclosure relates to wafer-level chip scale packages and more particularly, but not exclusively, to enhancing reliability of die separation of semiconductor chips fabricated with low-k dielectric materials.

BACKGROUND

A semiconductor chip or die (such as an image sensor chip) is typically fabricated on a single semiconductor wafer along with hundreds, and in some cases thousands, of copies of the same die. The cutting needed to separate individual dies from a semiconductor wafer—a process known as "dicing" or "wafer dicing"—can be done with a die saw (such as a diamond saw). Cuts are made along non-functional areas of semiconductor material, known as scribe lines, that separate the dies on the wafer from each other. Using a diamond saw introduces mechanical stress to the semiconductor wafer and can result in cracking at the die edges, compromising the integrity and reliability of the device on the die. An alternative to the diamond saw is laser scribing, which involves scanning a laser beam over the scribe lines of a semiconductor wafer, but this solution has low throughput and the required equipment is expensive.

The increasing demand for image sensors with faster processing speeds and better image quality, while at the same time decreasing the physical size of the image sensor chip, has led to smaller pixel cells sizes and smaller photosensitive regions or photodiodes. Advances in CMOS technology, such as the use of materials with low dielectric constant k, known as low-k dielectrics, that reduce cross coupling and parasitic capacitance between metal layers which make up the metal interconnect, are used to keep up with the decreasing image sensor chip size. However, low-k dielectrics are brittle due to their porous nature, which makes an image sensor with low-k dielectric prone to peeling and cracking when diamond saws are used to separate dies on a semiconductor wafer.

In addition to using low-k dielectric, another way to increase the size of a photodiode in a pixel cell, is to use a backside illuminated ("BSI") image sensor. BSI image sensors include a pixel array fabricated on a frontside of the semiconductor wafer, but receive light through a back surface of the image sensor. During fabrication of a BSI image sensor, the image sensor chip or device is first fabricated on a semiconductor wafer. When all the necessary elements have been formed in or on the device wafer, the device wafer is bonded to a carrier wafer for further processing. Due to the tradeoff of parameters such as bonding strength and wafer distortion, bonding strength can be maximized, but this can cause weakness at the bonding interface. This combination of low-k dielectric in the device wafer and weak bonding interface can increase the occurrence of peeling and cracking when a diamond saw is used to dice BSI dies from the combined wafer (device wafer plus carrier wafer).

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of a method to separate dies including low-dielectric constant (i.e., low-k) dielectric materials from wafers on which they are formed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Directional terminology such as "top," "down," and "under" is used with reference to the orientation of the figure(s) being described.

Figure 1A:
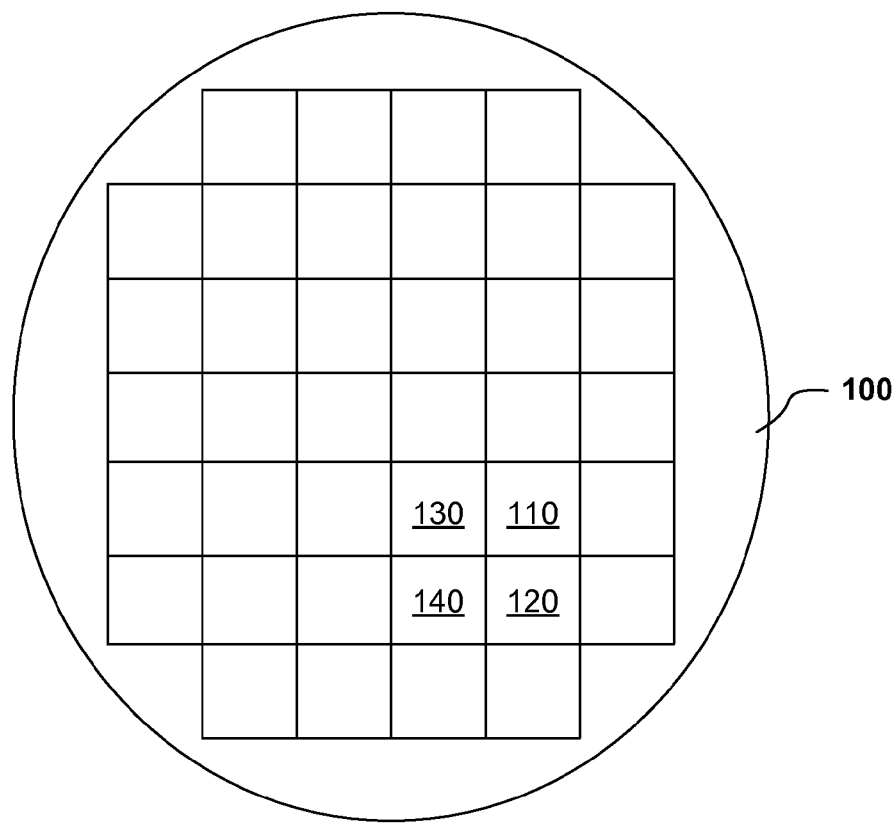
FIG. 1A is a plan view drawing illustrating a semiconductor wafer.

FIG. 1A is a diagram illustrating a semiconductor wafer 100 that includes a number of individual dies 110, 120, 130 and 140. The terms "die" and "dies" are generic terms that refer to a device that is formed in or on wafer 100. In one embodiment, one or more individual dies on wafer 100 can be a complementary metal oxide semiconductor (CMOS) image sensor, either frontside-illuminated (FSI) or backside-illuminated (BSI). In other embodiments, dies formed in or on wafer 100 can be one or more other kinds of electronic, optical, or mixed electronic/optical devices besides a CMOS sensor. In various embodiments, semiconductor wafer 100 may be composed of silicon, or gallium arsenide or other semiconductor materials.

Figure 1B:
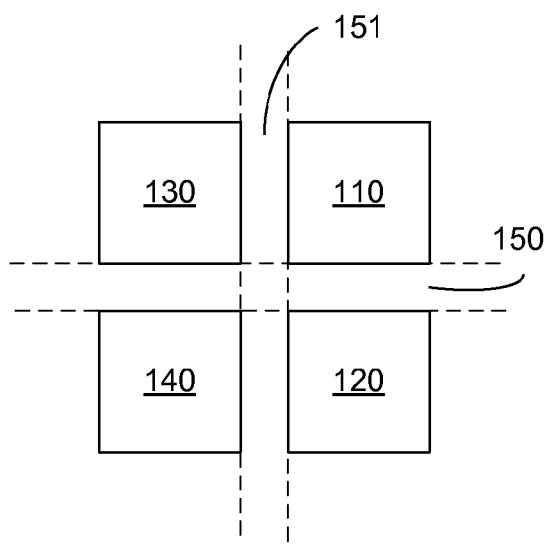
FIG. 1B is a plan view drawing illustrating in greater detail the spacing between individual dies formed on the semiconductor wafer in FIG. 1A.

FIG. 1B is a diagram illustrating in greater detail semiconductor wafer 100 and dies 110, 120, 130 and 140. Individual dies 110, 120, 130 and 140 are formed on wafer 100 such that there are non-functional wafer spaces between the dies. In the illustrated embodiment, non-functional space 150 is between dies 110 and 120 and between dies 130 and 140, while non-functional space 151 is between dies 110 and 130 and between dies 120 and 140. Often, individual dies are formed on wafer 100 such that the non-functional spaces together form lines that separate all the individual dies formed on the wafer. These non-functional areas of wafer 100 are known as scribe lines, and it is along these scribe lines that individual dies such as dies 110, 120, 130 and 140 are cut from wafer 100 when they are finished.

Figure 2A:
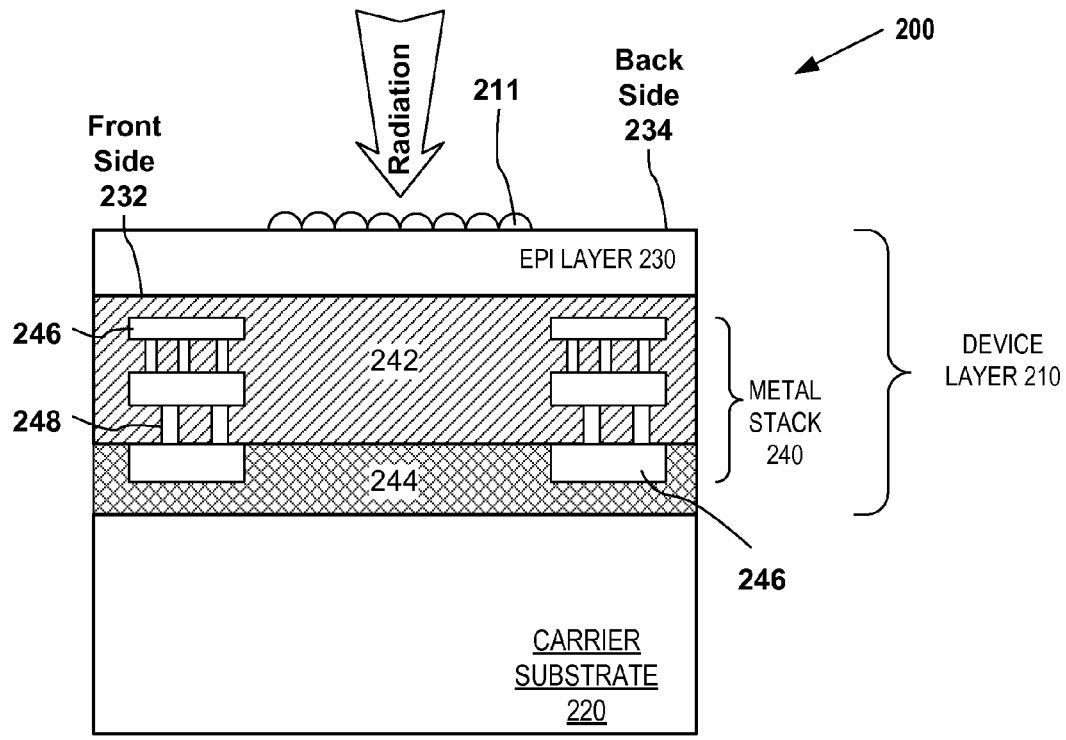
FIG. 2A is a cross-sectional drawing of a backside-illuminated (BSI) image sensor after die separation from the wafer.

FIG. 2A is a cross-sectional image of a backside-illuminated (BSI) image sensor 200 after die separation. BSI image sensor 200 comprises device layer 210 bonded to carrier substrate 220. Device layer 210 comprises an epitaxial ("epi") layer 230 and a metal stack 240. Optical components of the image sensor such as the photosensitive region, as well as electronic components that comprise the integrated circuit of an image sensor, such as the source and drain regions which make up the transistors, are found in epi layer 230. The optical and electronic components of the image sensor are usually formed on or near front side 232 of the epi layer.

Metal stack 240 is formed on a front side 232 of epi layer 230, with microlens array 211 formed on a backside 234 of epi layer 230. Within metal stack 240, low-k dielectric 242 separates adjacent metal interconnect layers 246 and vias 248 of metal stack 240. In the illustrated embodiment low-k dielectric 242 is shown as a single, uniform layer, but in other embodiments low-k dielectric 242 can include multiple layers of dielectric. In one embodiment in which low-k dielectric 242 has multiple layers, all the layers can be low-k dielectric, but in other multi-layer embodiments low-k dielectric 242 can include both low-k dielectric layers and non-low-k dielectric layers. For example, an embodiment could use low-k dielectric in lower metal layers (layers nearer to frontside 232), where cross-coupling between metal layers is more of a problem, and use non-low-k dielectric with higher metal layers (layers further from frontside 232). A dielectric layer 244 caps the low-k dielectric layer 242 to complete the metal stack; in one embodiment dielectric layer 244 is a non-low-k dielectric such as silicon dioxide (nominally $SiO_2$), but in other embodiments dielectric layer 244 can also be a low-k dielectric. In the illustrated embodiment metal stack 240 comprises three metal layers (three interconnect layers 246), but in other embodiments, metal stack 240 can have more or less metal layers.

Carrier substrate 220 is bonded to dielectric layer 244, and hence to metal stack 240 and to device layer 210. During manufacture of a wafer of BSI image sensors, epi layer 230 is thinned using processes such as grinding and/or chemical-mechanical polishing (CMP), so that radiation incident on back side 234 can better reach photosensitive elements that are formed closer to front side 232. The primary function of carrier substrate 220 is to support device layer 210 during backside thinning or other operations performed epi layer 230.

Figure 2B:
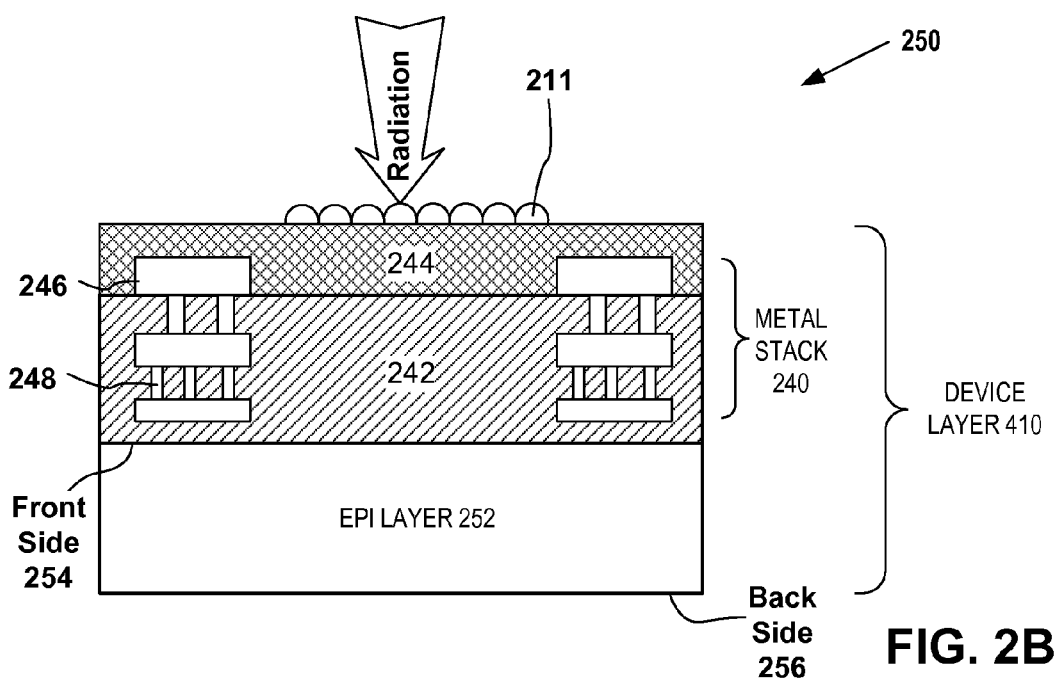
FIG. 2B is a cross-sectional drawing of a frontside-illuminated (FSI) image sensor after die separation from the wafer.

FIG. 2B illustrates an embodiment of a front-side illuminated (FSI) image sensor 250. FSI image sensor 250 is in most respects similar to BSI image sensor 200. Like BSI image sensor 200, FSI image sensor 250 comprises an epitaxial ("epi") layer 252 and a metal stack 240. Optical components of the image sensor such as the photosensitive region, as well as electronic components that comprise the integrated circuit of an image sensor, such as the source and drain regions which make up the transistors, are found in epi layer 252. The optical and electronic components of the image sensor are usually formed on or near front side 254 of the epi layer.

The primary structural differences between BSI image sensor 200 and FSI image sensor 250 are the position of microlens array 211, the thickness of epi layer 252, and the presence of carrier substrate 220. In FSI image sensor 250 light is incident on front side 254 of epi layer 252 through metal stack 240, so microlens array 211 is formed on top of metal stack 240, and specifically on dielectric layer 244 in the illustrated embodiment. Because radiation is incident on the front side of FSI image sensor 250, there is no need to thin epi layer 252 to improve transmission of light to the photosensitive elements. As a result, epi layer 252 of FSI image sensor 250 is substantially thicker than epi layer 230 of BSI image sensor 200. This lack of a need to thin epi layer 252 leads to the last primary structural difference: BSI image sensor 200 includes carrier substrate 220, FSI image sensor 250 does not.

Figure 3:
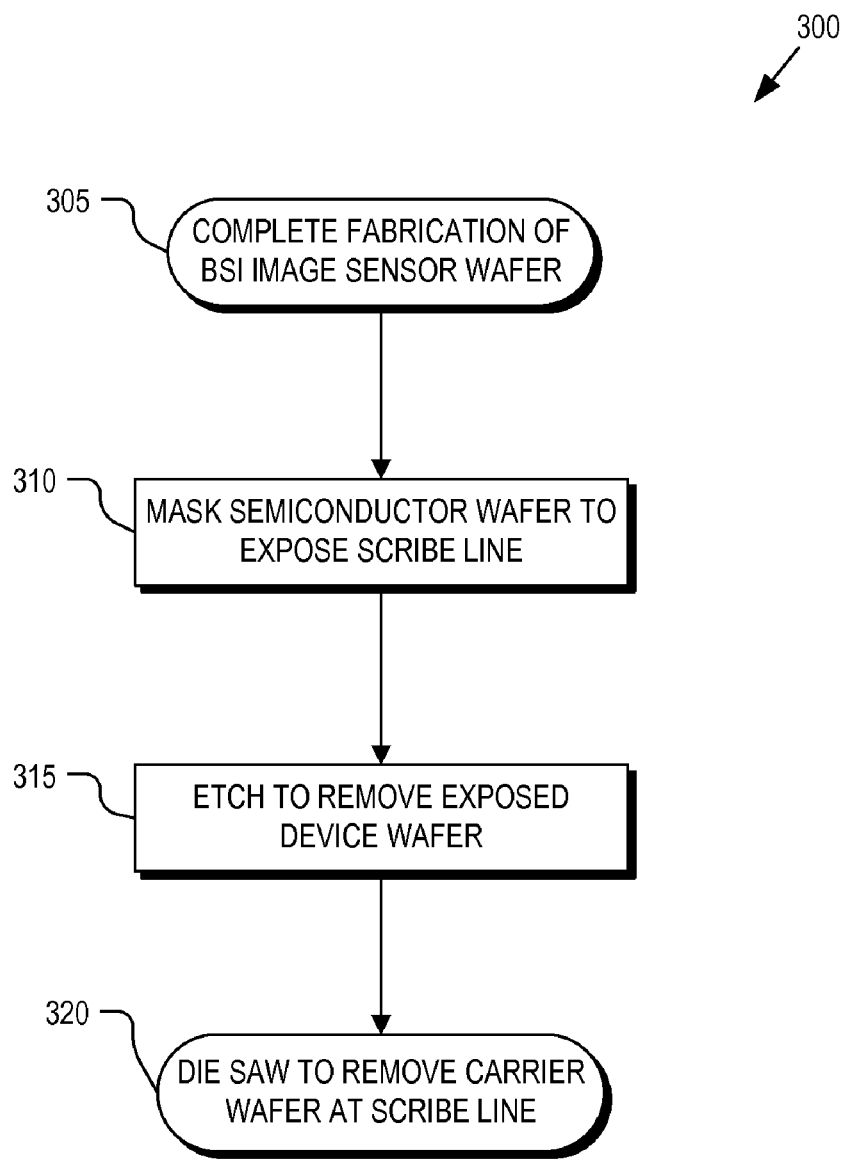
FIG. 3 is a flow chart illustrating an embodiment of a process for separating BSI image sensor dies from a semiconductor wafer.

FIGS. 3 and 4A-4D together illustrate an embodiment of a process for dicing BSI images sensor dies from a wafer. FIG. 3 is a flow chart illustrating the process 300, while FIGS. 4A-4D show the application of the process for separating (dicing) BSI image sensor dies 401 and 402 from a semiconductor wafer 400. The order in which some or all of the process blocks appear in each process should not be deemed limiting. Rather, one of ordinary skill in the art having the benefit of the present disclosure would understand that the process blocks may be executed in a variety of orders not illustrated. For instance, in the illustrated embodiment etching is first, followed by sawing, but in other embodiments the relevant parts could be sawed first and the remaining parts etched afterward.

Figure 4A:
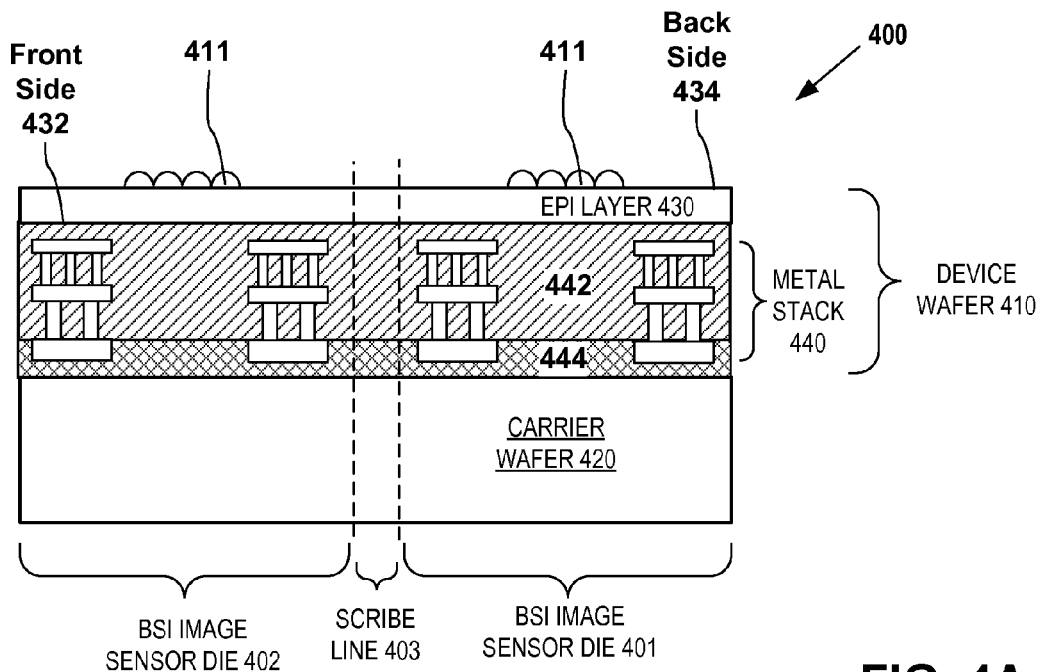
FIG. 4A is a cross-sectional drawing of a fully fabricated embodiment of a BSI image sensor wafer.

In process block 305, the fabrication of BSI image sensor dies 401 and 402 is complete. Following conventional techniques, optical and electronic components of the BSI image sensor, including diffusions (not shown), implants (not shown) and pixel circuitry (not shown) have been formed in or on epi layer 430. A color filter (not shown) and microlens array 411 are formed on the backside 434 of epi layer 430, while metal stack 440 is formed on frontside 432 as seen in FIG. 4A. Low-k dielectric 442 separates adjacent metal layers of metal stack 440, while dielectric 444 separates low-k dielectric layer 442 from carrier wafer 420. Carrier wafer 420 is bonded to dielectric layer 444, and hence to device wafer 410, to form wafer 400. On wafer 400, BSI image sensor dies 401 and 402 are separated by scribe line 403.

Figure 4B:
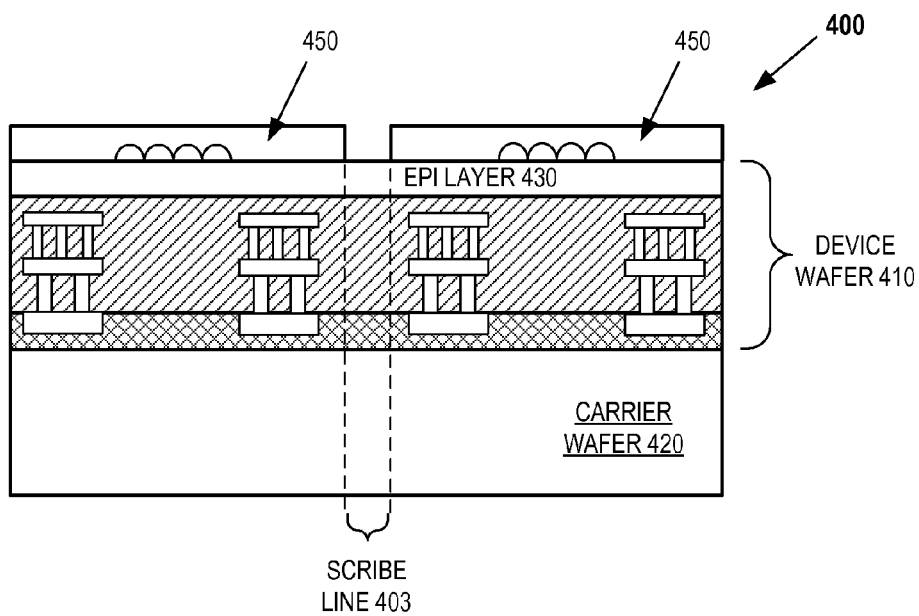
FIG. 4B is a cross-sectional drawing of a fully fabricated embodiment of a BSI image sensor wafer with a mask to expose the scribe line.

In process block 310, a mask 450 is formed on the backside 434 of epi layer 430 (hence on the backside of device wafer 410), but with openings therein that expose backside 434 in areas that are substantially in alignment with scribe line 403 of device wafer 410 as shown in FIG. 4B. In one embodiment, mask 450 is formed by depositing a layer of photoresist on backside 434 and photolithographically patterning and etching the photoresist to expose the parts of backside 434 that are substantially aligned with scribe lines 430. In other embodiments, other method and materials can be used to form mask 450.

Figure 4C:
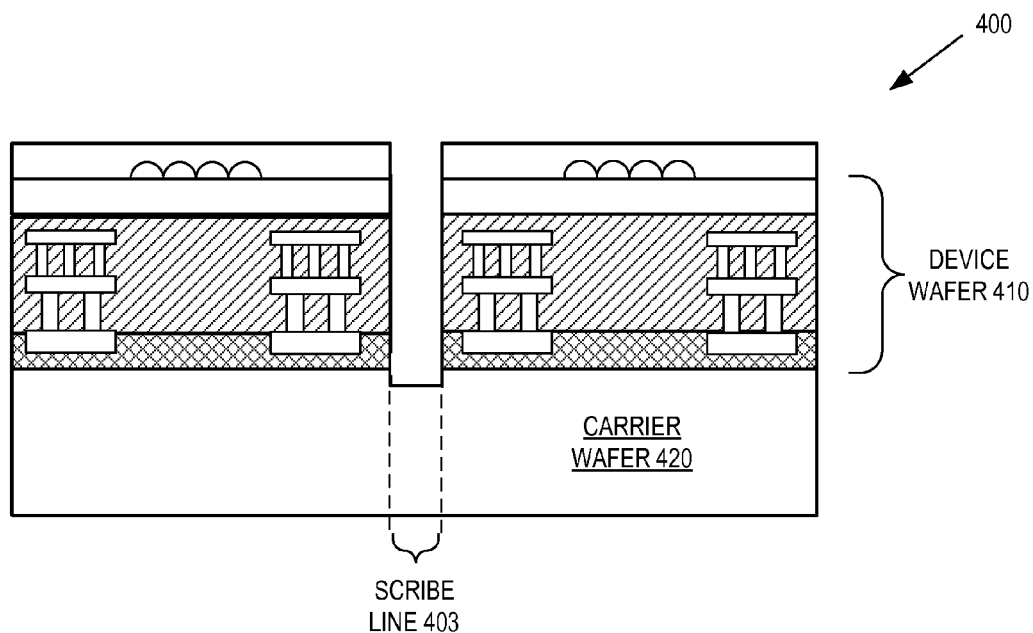
FIG. 4C is a cross-sectional drawing of a fully fabricated embodiment of a BSI image sensor wafer after an etch is used to remove the scribe line portion of the exposed device wafer.

In process block 315, etching is used to remove device wafer materials not masked by mask 450, as shown in FIG. 4C. A dry reactive etch or wet etch can be used to remove the semiconductor material of device wafer 410, starting from backside 434, through the thickness of device wafer 410 down to carrier wafer 420. Etching is stopped at an intermediate position between the two surfaces of wafer 400; in the illustrated embodiment the intermediate position is in carrier wafer 420 near the bonding interface between device wafer 410 and carrier wafer 420. By using etching to remove the low-k dielectric material of device wafer 410 at scribe line 403 instead of using a die saw, the occurrence of peeling and cracking of device wafer 410 due to the mechanical stress of a die saw can be reduced or eliminated. Also, by extending the etch through at least the bonding interface between device wafer 410 and carrier wafer 420, problems caused by sawing across the bonding interface are eliminated.

Figure 4D:
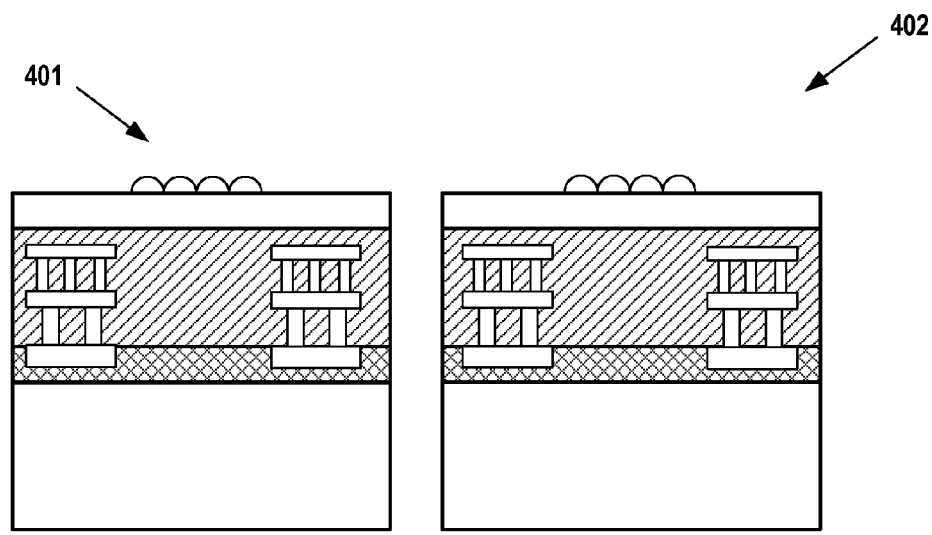
FIG. 4D is a cross-sectional drawing of a fully fabricated embodiment of a BSI image sensor after a die saw is used to remove the exposed semiconductor material of the carrier wafer.
Figure 5:
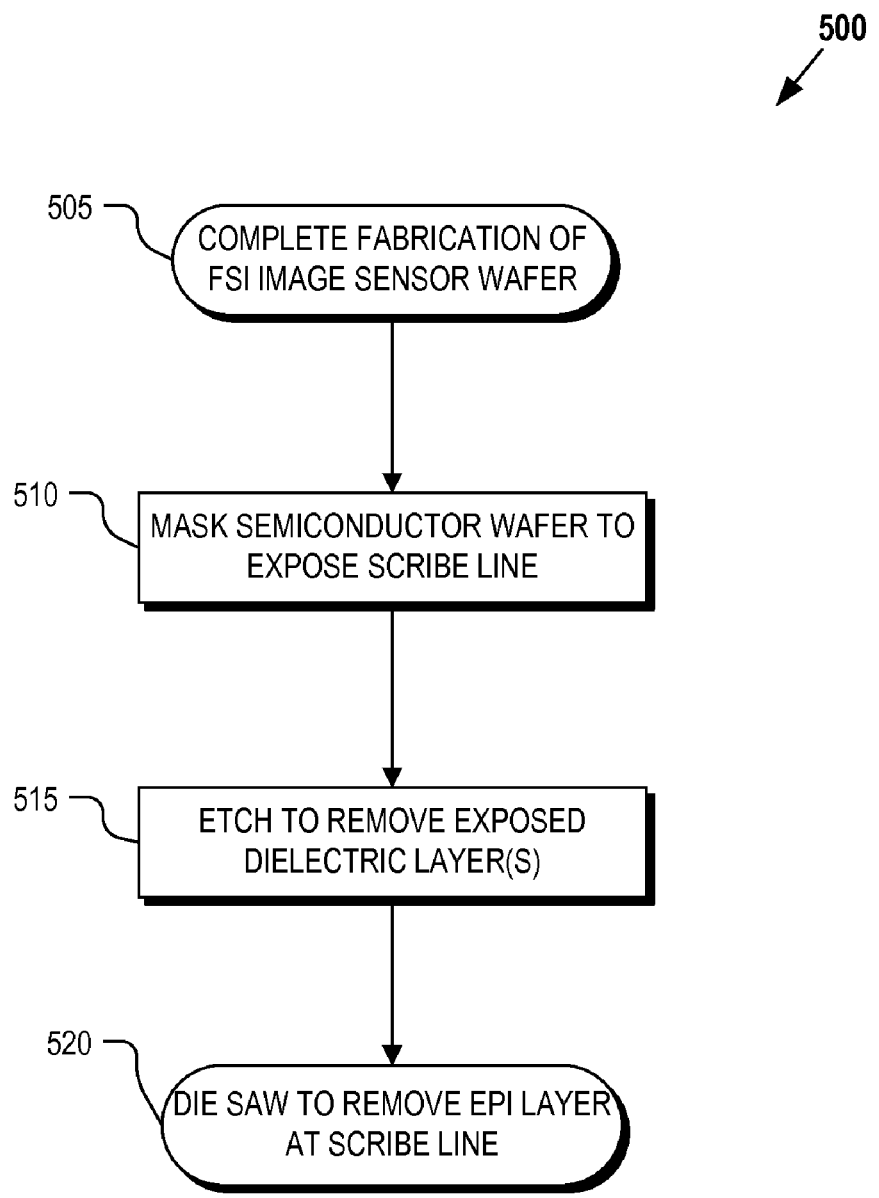
FIG. 5 is a flow chart illustrating an embodiment of a process for separating FSI image sensor dies from a semiconductor wafer.

In process block 320, a die saw is used to remove the remaining semiconductor material of carrier wafer 420 at scribe line 403, as shown in FIG. 4D. The result is that dies 401 and 402 are diced from the wafer and separated from each other. Since the device wafer materials of device wafer 410 at scribe line 403 has already been removed in the etch step, the mechanical stress introduced by a die saw will not affect the low-k dielectric layer in device wafer 410 or the bonding interface between device wafer 410 and carrier wafer 420.

The introduction of this dual-step die separation technique adds cost to the fabrication sequence, but an increase in the number of good dies per wafer should compensate for that additional cost. Added benefits also are derived from the reduction of stress fractures on the side of the die metallization stack which are known to lead to reliability failures over time.

FIGS. 5 and 6A-6D together illustrate an embodiment of a process for dicing FSI images sensor dies from a wafer. FIG. 3 is a flow chart illustrating the process 500, while FIGS. 6A-6D show the application of the process for separating (dicing) FSI image sensor dies 601 and 602 from a semiconductor wafer 600. The order in which some or all of the process blocks appear in each process should not be deemed limiting. Rather, one of ordinary skill in the art having the benefit of the present disclosure would understand that the process blocks may be executed in a variety of orders not illustrated. For instance, in the illustrated embodiment etching is first, followed by sawing, but in other embodiments the relevant parts could be sawed first and the remaining parts etched afterward.

Figure 6A:
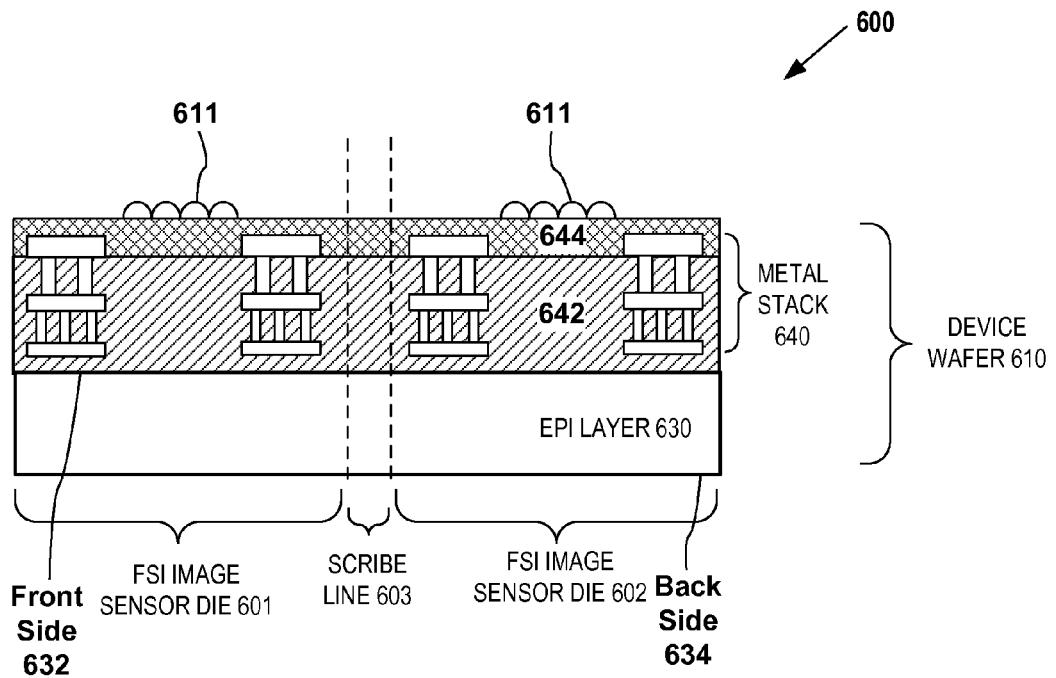
FIG. 6A is a cross-sectional drawing of a fully fabricated embodiment of a FSI image sensor wafer.

In process block 505, the fabrication of FSI image sensor dies 601 and 602 is complete. Following conventional techniques, optical and electronic components of the FSI image sensor, including diffusions (not shown), implants (not shown) and pixel circuitry (not shown) have been formed in or on epi layer 630. Low-k dielectric 642 separates adjacent metal layers of metal stack 640, while dielectric 644 is formed on low-k dielectric 642. A color filter (not shown) and microlens array 611 are formed on dielectric layer 644, as seen in FIG. 6A. On wafer 600, FSI image sensor dies 601 and 602 are separated by scribe line 603.

Figure 6B:
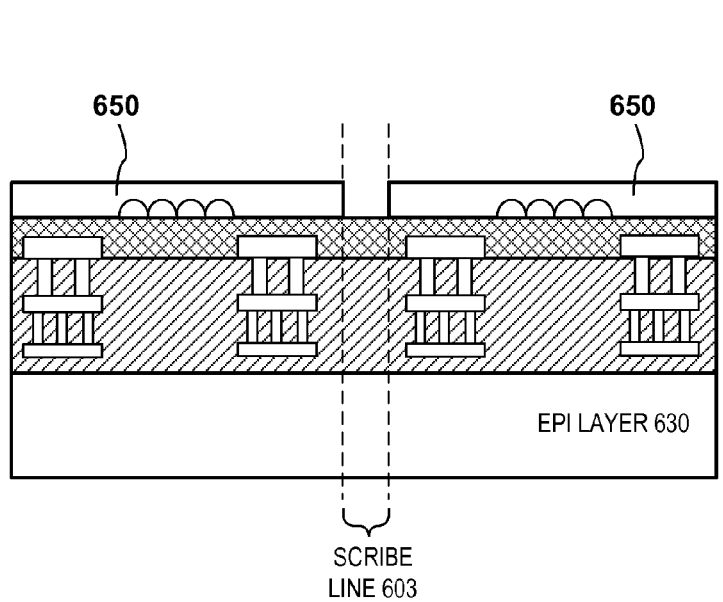
FIG. 6B is a cross-sectional drawing of a fully fabricated embodiment of a FSI image sensor wafer with a mask to expose the scribe line.

In process block 510, mask 650 is formed on dielectric layer 644 (hence on the frontside of device wafer 610), but with openings therein that expose dielectric layer 644 in areas substantially aligned with scribe line 603 on device wafer 610, as shown in FIG. 6B. In one embodiment, mask 650 is formed by depositing a layer of photoresist on dielectric layer 644 and photolithographically patterning and etching the photoresist to expose parts of dielectric layer 644 that are substantially aligned with scribe lines 603. In other embodiments, other method and materials can be used to form mask 650.

Figure 6C:
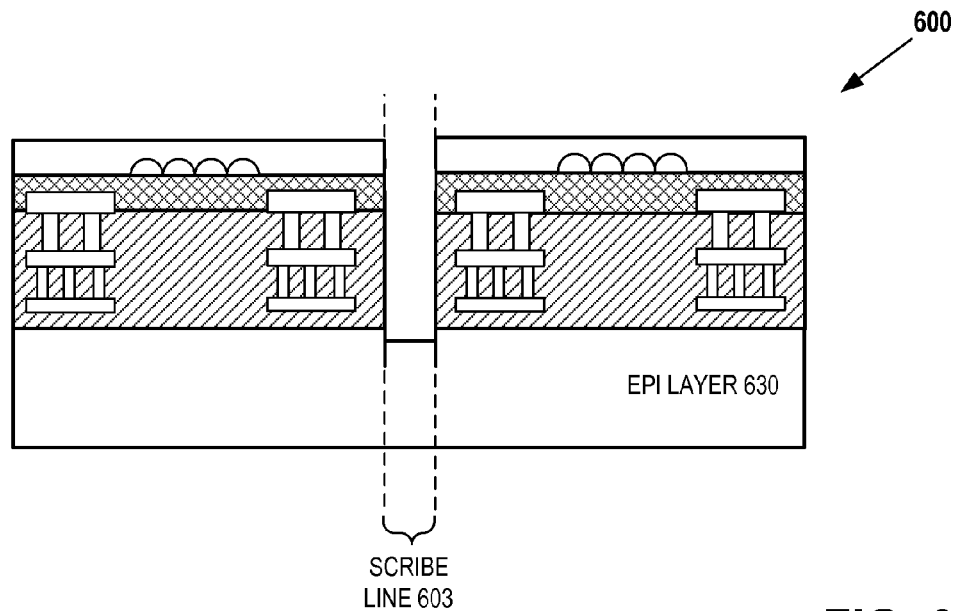
FIG. 6C is a cross-sectional drawing of a fully fabricated embodiment of a FSI image sensor wafer after an etch is used to remove the scribe line portion of the exposed device wafer.

In process block 515, etching is used to remove device wafer materials not masked by mask 650, as shown in FIG. 6C. A dry reactive etch or wet etch can be used to remove dielectric layers in metal stack 640, starting from frontside of device wafer 610, through the thickness of the metal stack down to epi layer 630. Etching is stopped after it passes an intermediate position between the surfaces of wafer 600; in the illustrated embodiment the intermediate position is in the epi layer near the interface between metal stack 640 and epi layer 630. By using etching to remove the low-k dielectric material of device wafer 610 at scribe line 603 instead of using a die saw, the occurrence of peeling and cracking of device wafer 610 due to the mechanical stress of a die saw can be reduced or eliminated. Also, by extending the etch through at least the interface between low-k dielectric 642 and epi layer 630, problems caused by sawing across the interface are eliminated.

Figure 6D:
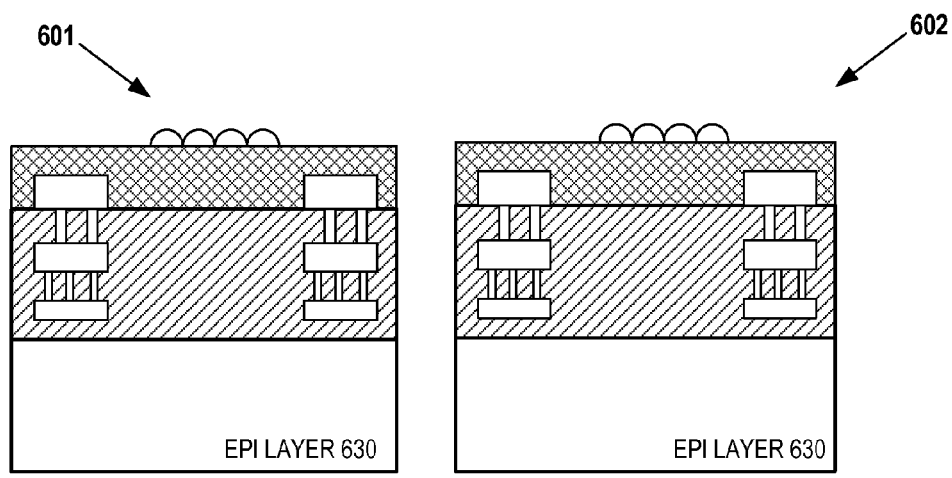
FIG. 6D is a cross-sectional drawing of a fully fabricated embodiment of a FSI image sensor after a die saw is used to remove the exposed semiconductor material of the carrier wafer.

In process block 520, a die saw is used to remove the semiconductor material of epi layer 630 at scribe line 603, as shown in FIG. 6D. Since the dielectric materials of device wafer 610 at scribe line 603 have already been removed in the etch step, the mechanical stress introduced by a die saw will not affect the low-k dielectric materials in metal stack 640.

The introduction of this dual step die separation technique adds cost to the fabrication sequence, but an increase in the number of good dies per wafer should compensate for that additional cost. Added benefits also are derived from the reduction of stress fractures on the side of the die metallization stack which are known to lead to reliability failures over time.

Figure 7:
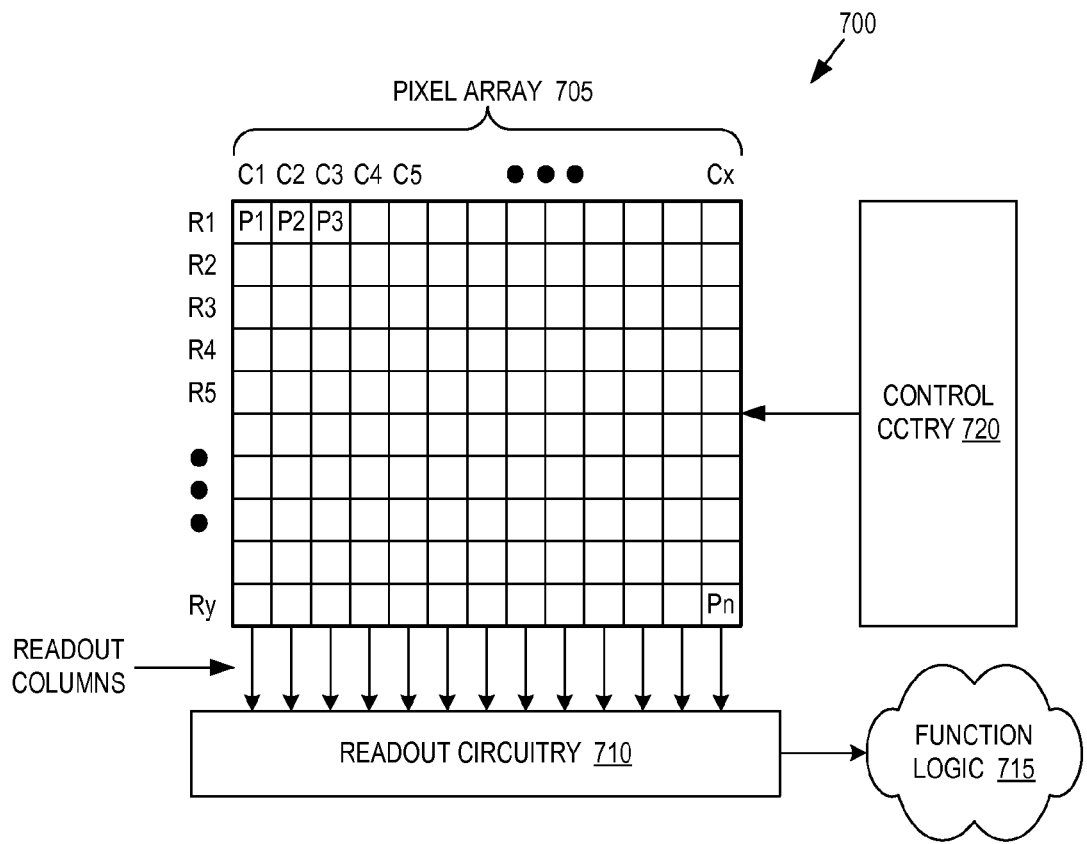
FIG. 7 is a block diagram illustrating an embodiment of a image sensor die that can be a BSI image sensor die or a FSI image sensor die.

FIG. 7 is a block diagram illustrating an embodiment of a BSI or FSI imaging system 700. The illustrated embodiment of imaging system 700 includes a pixel array 705, readout circuitry 710, function logic 715, and control circuitry 720.

Pixel array 705 is a two-dimensional ("2D") array of backside illuminated imaging sensors or pixels (e.g., pixels P1, P2 . . . , Pn). In one embodiment, each pixel is a complementary metal-oxide-semiconductor ("CMOS") imaging pixel and at least one pixel in the array can be one of the BSI pixel embodiments shown in FIG. 6. As illustrated, each pixel in the array is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is read out by readout circuitry 710 and transferred to function logic 715. Readout circuitry 710 can include amplification circuitry, analog-to-digital ("ADC") conversion circuitry, or otherwise. Function logic 715 can simply store the image data or even manipulate the image data by applying post image effects (e.g., crop, rotate, remove red eye, adjust brightness, adjust contrast, or otherwise). Control circuitry 720 is coupled to pixel array 705 to control operational characteristic of pixel array 705.

Figure 8:
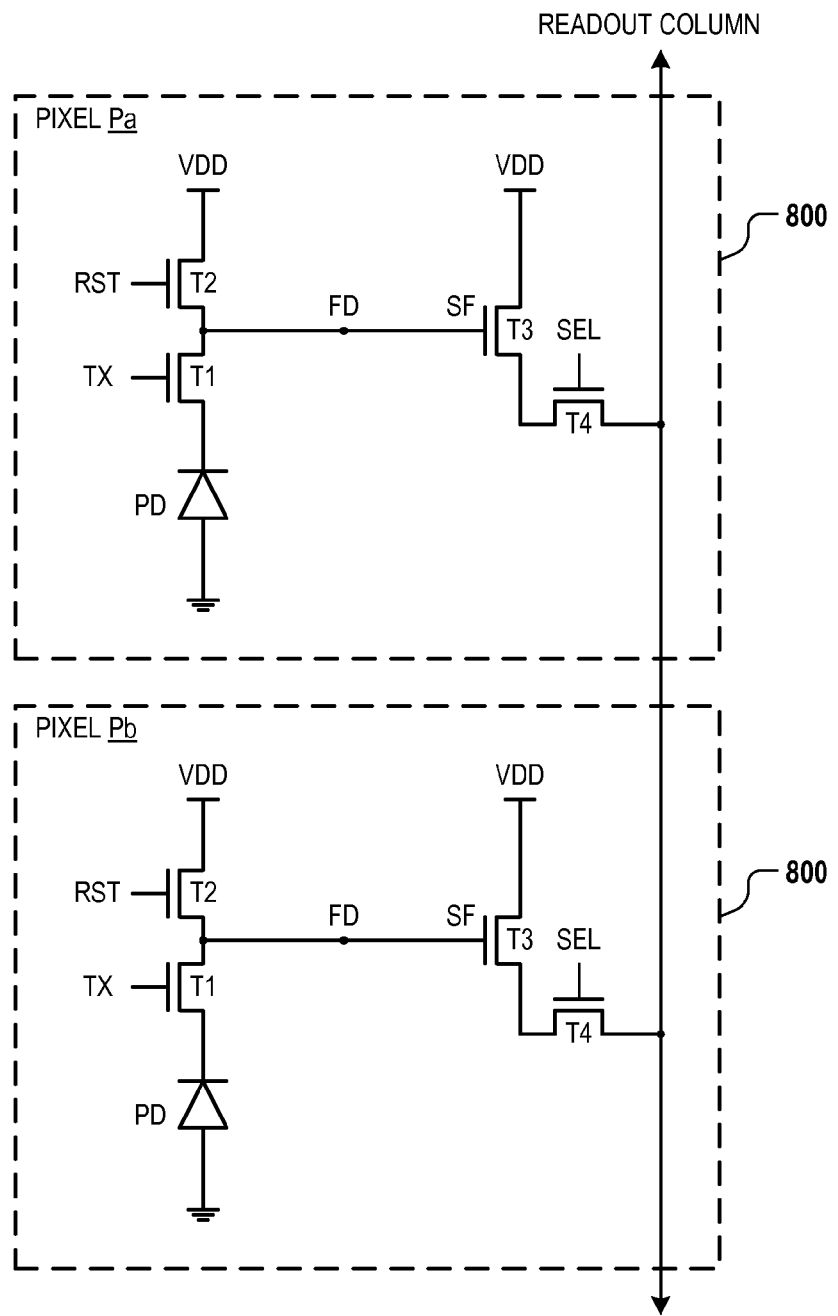
FIG. 8 is a circuit diagram illustrating pixel circuitry of two four-transistor ("4T") pixels within an embodiment of a BSI or FSI imaging array.

FIG. 8 is a circuit diagram illustrating an embodiment of pixel circuitry 800 of two four-transistor ("4T") pixels within a BSI imaging array, in accordance with an embodiment of the invention. Pixel circuitry 800 is one possible pixel circuitry architecture for implementing each pixel within pixel array 705 of FIG. 7, but it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 8, BSI pixels Pa and Pb are arranged in two rows and one column. The illustrated embodiment of each pixel circuitry 800 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD can be coupled to a storage capacitor for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 800 to the readout column line under control of a select signal SEL. In one embodiment, the TX signal, the RST signal, and the SEL signal are generated by control circuitry 720.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A method for separating dies from a wafer having first and second sides, the process comprising:
    masking the first side of the wafer, the mask including openings therein to expose parts of the first side substantially aligned with scribe lines of the wafer;
    etching from the exposed parts of the first side of the wafer until an intermediate position between the first and second sides; and
    sawing the remainder of the wafer, starting from the intermediate position until reaching the second side;
    wherein the wafer comprises:
        a semiconductor layer having a frontside and a backside,
        a metal stack formed on the frontside of the semiconductor layer, and
        a carrier wafer having a free surface and a bonding surface, the bonding surface bonded to the metal stack, wherein the backside of the semiconductor layer is the first side of the wafer, the free surface of the carrier wafer is the second side of the wafer, and the intermediate position is in the carrier wafer near the bonding surface.

2. The method of claim 1 wherein the etch is a dry reactive etch.

3. The method of claim 1 wherein the etch is a wet etch.

4. The method of claim 1 wherein the semiconductor layer is an epitaxial layer.

5. The method of claim 4 wherein the dies are backside-illuminated image sensors.

6. The method of claim 1 wherein sawing comprises using a diamond saw.

7. A method for separating dies from a wafer having first and second sides, the process comprising:
    masking the first side of the wafer, the mask including openings therein to expose parts of the first side substantially aligned with scribe lines of the wafer;
    etching from the exposed parts of the first side of the wafer until an intermediate position between the first and second sides; and
    sawing the remainder of the wafer, starting from the intermediate position until reaching the second side;
    wherein the wafer comprises:
        a semiconductor layer having a frontside and a backside, and
        a metal stack formed on the frontside of the semiconductor layer, wherein a surface of the metal stack comprises the first side of the wafer, the backside of the semiconductor layer comprises the second side of the wafer, and the intermediate position is in the semiconductor layer near the frontside of the semiconductor layer.

8. The method of claim 7 wherein the etch is a dry reactive etch.

9. The method of claim 7 wherein the etch is a wet etch.

10. The method of claim 7 wherein the semiconductor layer is an epitaxial layer.

11. The method of claim 10 wherein the dies are frontside-illuminated image sensors.

12. The method of claim 7 wherein sawing comprises using a diamond saw.

* * * * *